US012582004B2

(12) United States Patent
Li et al.

(10) Patent No.: US 12,582,004 B2
(45) Date of Patent: Mar. 17, 2026

(54) DISPLAY PANEL, MANUFACTURING METHOD THEREOF AND DISPLAY DEVICE

(71) Applicant: SHENZHEN CHINA STAR OPTOELECTRONICS SEMICONDUCTOR DISPLAY TECHNOLOGY CO., LTD., Guangming New District Shenzhen (CN)

(72) Inventors: Zhuhui Li, Guangming New District Shenzhen (CN); Yanfen Li, Guangming New District Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 569 days.

(21) Appl. No.: 18/081,463

(22) Filed: Dec. 14, 2022

(65) Prior Publication Data

US 2024/0063197 A1 Feb. 22, 2024

(30) Foreign Application Priority Data

Aug. 17, 2022 (CN) .......................... 202210985629.0

(51) Int. Cl.
*H01L 25/16* (2023.01)
*H01L 23/00* (2006.01)
*H10H 20/857* (2025.01)

(52) U.S. Cl.
CPC ............ *H01L 25/167* (2013.01); *H01L 24/05* (2013.01); *H01L 24/06* (2013.01); *H10H 20/857* (2025.01);

(Continued)

(58) Field of Classification Search
None
See application file for complete search history.

(56) References Cited

U.S. PATENT DOCUMENTS

| | | | | |
|---|---|---|---|---|
| 11,386,845 | B2 * | 7/2022 | Yang | .................... G09G 3/3233 |
| 2023/0171996 | A1 * | 6/2023 | Li | ........................ H10K 59/131 |
| | | | | 257/40 |

FOREIGN PATENT DOCUMENTS

| | | | | |
|---|---|---|---|---|
| CN | 105140260 | A | 12/2015 | |
| CN | 105226068 | A * | 1/2016 | ......... H01L 27/3248 |

(Continued)

OTHER PUBLICATIONS

Chinese Office Action issued in corresponding Chinese Patent Application No. 202210985629.0 dated Apr. 30, 2025, pp. 1-8.

*Primary Examiner* — Michael Lebentritt

(74) *Attorney, Agent, or Firm* — PV IP PC; Peter Stecher; Wei Te Chung

(57) ABSTRACT

A display panel, a manufacturing method thereof, and a display device are provided. The display panel includes a driving substrate, a first light-emitting device layer disposed on a side of the driving substrate, and a second light-emitting device layer disposed on a side the driving substrate away from the first light-emitting device layer. The first light-emitting device layer includes a plurality of first light-emitting devices. The second light-emitting device layer includes a plurality of second light-emitting devices. The driving substrate includes a plurality of driving thin-film transistors. A driving thin-film transistor is connected to a first light-emitting device and a second light-emitting device. The first light-emitting device layer and the second light-emitting device layer are respectively disposed on two sides of the driving substrate. A single driving thin-film (Continued)

transistor is configured to drive the first light-emitting device and the second light-emitting device simultaneously to emit light.

8 Claims, 6 Drawing Sheets

(52) U.S. Cl.
CPC .... *H01L 24/08* (2013.01); *H01L 2224/05567* (2013.01); *H01L 2224/05571* (2013.01); *H01L 2224/05573* (2013.01); *H01L 2224/06181* (2013.01); *H01L 2224/08145* (2013.01)

(56) References Cited

FOREIGN PATENT DOCUMENTS

| CN | 106601777 A | | 4/2017 | |
| CN | 109461744 A | | 3/2019 | |
| CN | 110531549 A | * | 12/2019 | ............ G02B 6/005 |
| CN | 111180492 A | * | 5/2020 | |
| CN | 111489658 A | | 8/2020 | |
| CN | 112150970 A | | 12/2020 | |
| CN | 112992963 A | | 6/2021 | |
| CN | 117750807 A | * | 3/2024 | |

* cited by examiner

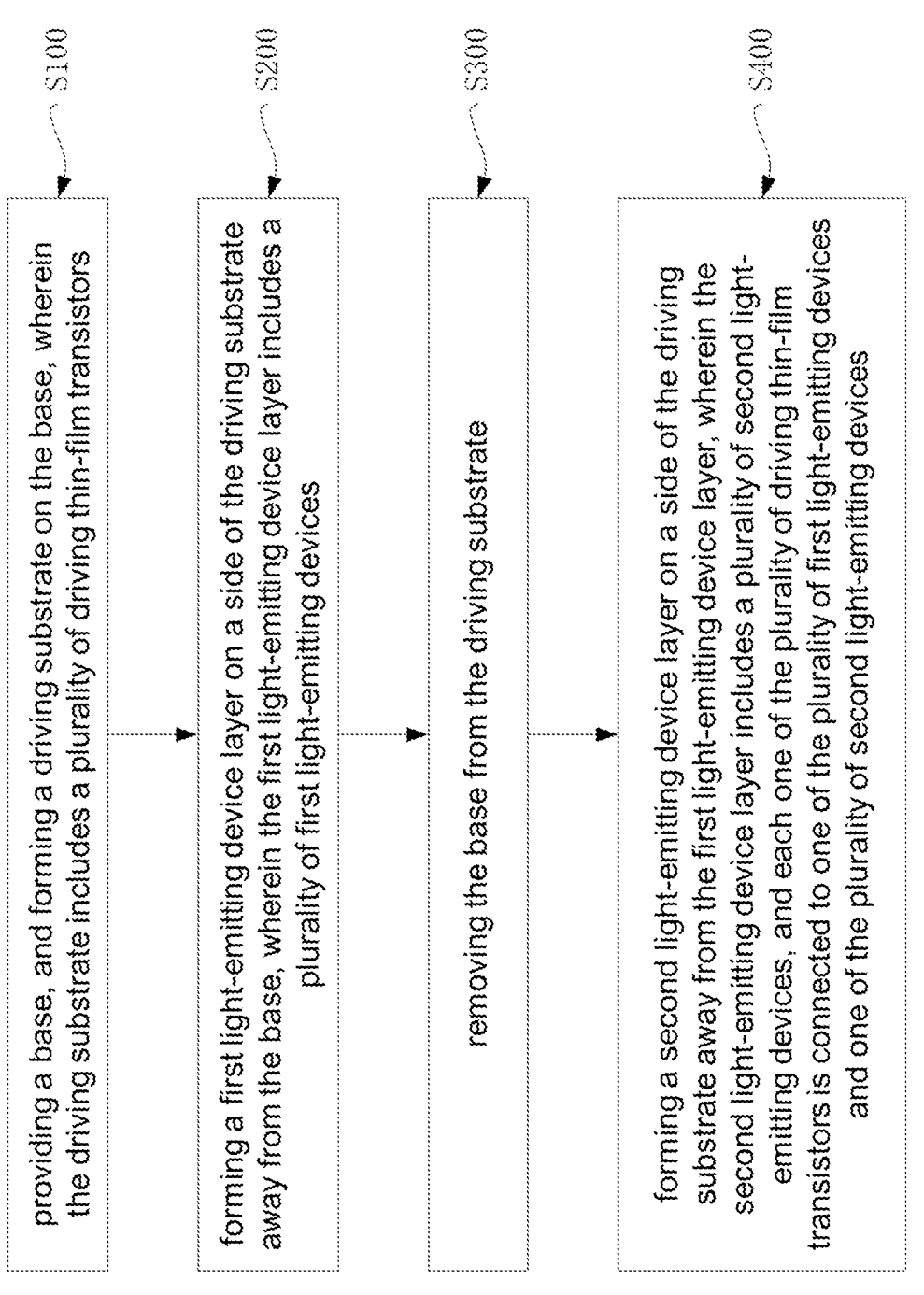

S100 providing a base, and forming a driving substrate on the base, wherein the driving substrate includes a plurality of driving thin-film transistors

S200 forming a first light-emitting device layer on a side of the driving substrate away from the base, wherein the first light-emitting device layer includes a plurality of first light-emitting devices

S300 removing the base from the driving substrate

S400 forming a second light-emitting device layer on a side of the driving substrate away from the first light-emitting device layer, wherein the second light-emitting device layer includes a plurality of second light-emitting devices, and each one of the plurality of driving thin-film transistors is connected to one of the plurality of first light-emitting devices and one of the plurality of second light-emitting devices

FIG. 2

DISPLAY PANEL, MANUFACTURING METHOD THEREOF AND DISPLAY DEVICE

CROSS-REFERENCE TO RELATED PATENT APPLICATION

This application claims priority to Chinese patent application No. 202210985629.0, titled "DISPLAY PANEL, MANUFACTURING METHOD THEREOF AND DISPLAY DEVICE", filed on Aug. 17, 2022, with the China National Intellectual Property Administration, which is incorporated by reference in the present application in its entirely.

FIELD

The present disclosure relates to the field of display technology, and more particularly, to a display panel, a manufacturing method thereof, and a display device.

BACKGROUND

With development of display technology, double-sided display products have received extensive attention.

At present, a double-sided display screen mainly adopts two pieces of display panels, such as liquid crystal display (LCD) panels, light-emitting diode (LED) panels, or organic light-emitting diode (OLED) panels to be stuck together, so as to achieve a double-sided display. A structure as such is likely to lead to a large thickness of the double-sided display screen, which is not suitable for requirements of lightening and thinning for large-sized double-sided display devices.

SUMMARY

The present application provides a display panel, a manufacturing method thereof, and a display device, so as to solve a technical problem of a large thickness of a double-sided display screen.

The present application provides a display panel including a driving substrate; a first light-emitting device layer disposed on a side of the driving substrate, wherein the first light-emitting device layer includes a plurality of first light-emitting devices; and a second light-emitting device layer disposed on a side of the driving substrate away from the first light-emitting device layer, wherein the second light-emitting device layer includes a plurality of second light-emitting devices.

The driving substrate includes a plurality of driving thin-film transistors, and each one of the plurality of driving thin-film transistors is connected to one of the plurality of first light-emitting devices and one of the plurality of second light-emitting devices.

In the display panel provided by the present application, the driving substrate includes a first insulating layer, a second insulating layer disposed on a side of the first insulating layer; a first metal layer disposed on a side of the second insulating layer away from the first insulating layer, wherein the first metal layer includes a first terminal, a second terminal, and a power line that are connected to one of the plurality of first light-emitting devices; and a second metal layer disposed on a side of the first insulating layer away from the second insulating layer, wherein the second metal layer includes a third terminal and a fourth terminal that are connected to one of the plurality of second light-emitting devices.

The first terminal and the third terminal are connected to a drain of one of the plurality of driving thin-film transistors, and the second terminal and the fourth terminal are connected to the power line.

In the display panel provided by the present application, the driving substrate includes a first through hole and a second through hole passing through both the second insulating layer and the first insulating layer, the first terminal is connected to the third terminal through the first through hole, and the second terminal is connected to the fourth terminal through the second through hole.

In the display panel provided by the present application, the first metal layer further includes a source and the drain of one of the plurality of driving thin-film transistors, and the first terminal is connected to the drain.

In the display panel provided by the present application, the driving substrate further includes a third insulating layer disposed between the second insulating layer and the first insulating layer; a third metal layer disposed between the second insulating layer and the third insulating layer, wherein the third metal layer includes a gate of one of the plurality of driving thin-film transistors; and a semiconductor layer disposed between the third insulating layer and the first insulating layer, wherein the semiconductor layer includes an active layer of one of the plurality of driving thin-film transistors, and the source and the drain of one of the plurality of driving thin-film transistors are respectively connected to the active layer.

The second metal layer further includes a light shielding portion, and an orthographic projection of the light shielding portion on the driving substrate in a direction perpendicular to the driving substrate covers an orthographic projection of the active layer on the driving substrate in the direction perpendicular to the driving substrate.

In the display panel provided by the present application, the driving substrate includes a third through hole passing through both the second insulating layer and the first insulating layer, and the source is connected to the light shielding portion through the third through hole.

In the display panel provided by the present application, the display panel further includes a first encapsulation layer and a second encapsulation layer, the first encapsulation layer covers the first light-emitting device layer, and the second encapsulation layer cover the second light-emitting device layer.

Correspondingly, the present application further provides a manufacturing method of a display panel. The manufacturing method includes the steps of providing a base, and forming a driving substrate on the base, wherein the driving substrate includes a plurality of driving thin-film transistors; forming a first light-emitting device layer on a side of the driving substrate away from the base, wherein the first light-emitting device layer includes a plurality of first light-emitting devices; removing the base from the driving substrate; and forming a second light-emitting device layer on a side of the driving substrate away from the first light-emitting device layer, wherein the second light-emitting device layer includes a plurality of second light-emitting devices, and each one of the plurality of driving thin-film transistors is connected to one of the plurality of first light-emitting devices and one of the plurality of second light-emitting devices.

In the manufacturing method of the display panel provided by the present application, the base includes a rigid substrate and a flexible substrate formed on the rigid substrate.

A step of removing the base from the driving substrate includes removing the rigid substrate by a laser removing method; and removing the rigid substrate by a dry etching method.

Correspondingly, the present application further provides a display device, and the display device includes the display panel according to any one of the afore-mentioned embodiments.

In the embodiments of the present application, the first light-emitting device layer and the second light-emitting device layer are respectively disposed on two sides of the driving substrate, and a single one of the plurality of driving thin-film transistors can be configured to drive each of the plurality of first light-emitting devices in the first light-emitting device layer and each of the plurality of second light-emitting devices in the second light-emitting device layer on the front and the back to emit light, simultaneously, which reduces a complexity of the double-sided display structure and achieves lightening and thinning of the double-sided display panel.

DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

FIG. 2 is a flowchart of a manufacturing method of a display panel provided by an embodiment of the present application.

DETAILED DESCRIPTION

Figure 1:
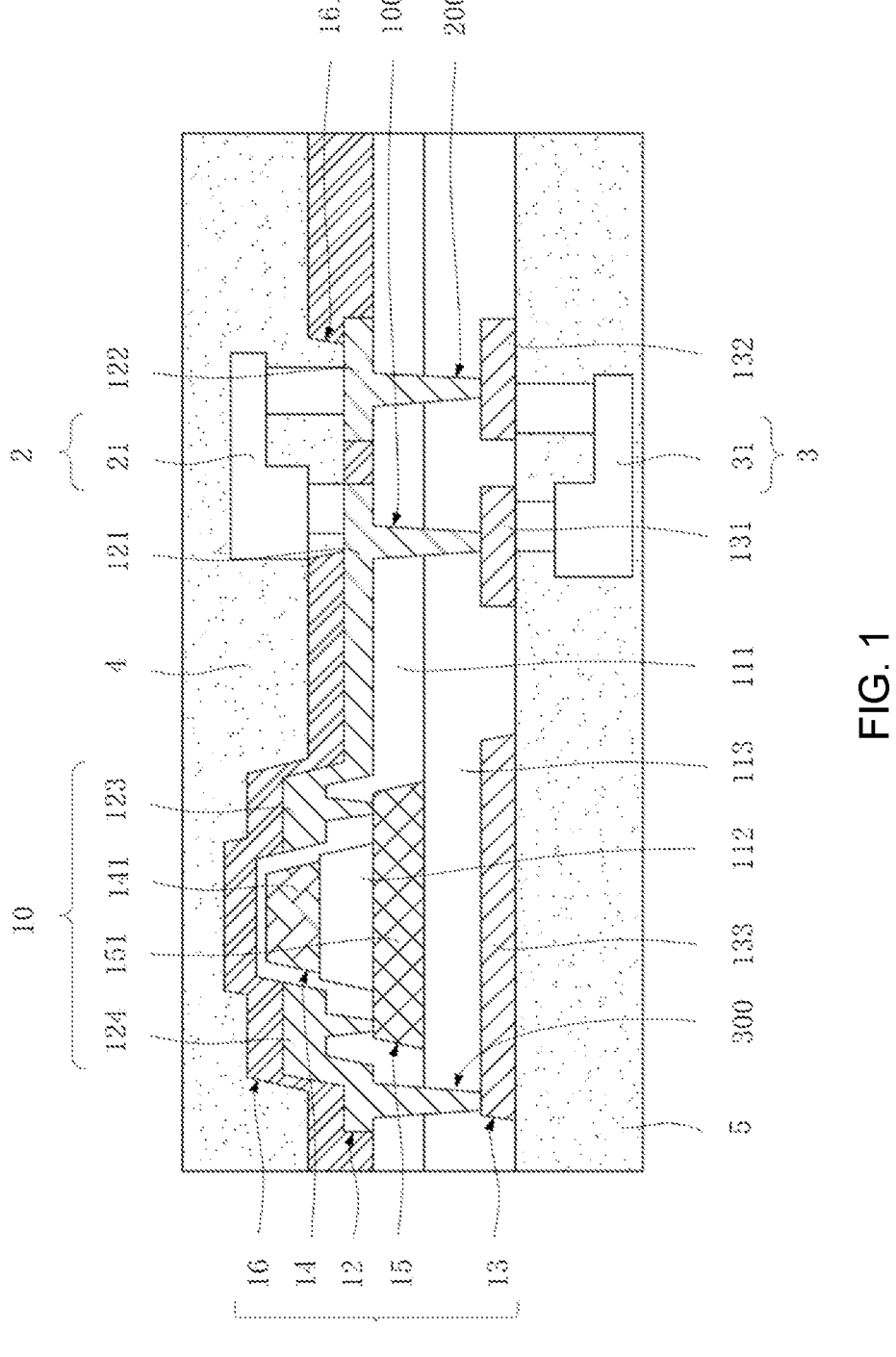
FIG. 1 is a structural schematic view of a display panel provided by an embodiment of the present application.

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

The present application provides a display panel, a manufacturing method thereof, and a display device, which will be described in detail below. It should be noted that the description order of the following embodiments is not intended to limit a preferred order of the embodiments.

Referring to FIG. 1, and FIG. 3 to FIG. 6, an embodiment of the present application provides a display panel. The display panel includes: a driving substrate 1, a first light-emitting device layer 2, and a second light-emitting device layer 3.

The first light-emitting device layer 2 is disposed on a side of the driving substrate 1, and the first light-emitting device layer 2 includes a plurality of first light-emitting devices 21.

The second light-emitting device layer 3 is disposed on a side of the driving substrate 1 away from the first light-emitting device layer 2, and the second light-emitting device layer 3 includes a plurality of second light-emitting devices 31.

The driving substrate 1 includes a plurality of driving thin-film transistors 10, and each of the plurality of driving thin-film transistors 10 is connected to one of the plurality of first light-emitting devices 21 and one of the plurality of second light-emitting devices 31.

It can be understood that, in this embodiment, the first light-emitting device layer 2 and the second light-emitting device layer 3 are respectively disposed on two sides of the driving substrate 1, and a single driving thin-film transistor 10 can be configured to drive each of the plurality of first light-emitting devices 21 in the first light-emitting device layer 2 and each of the plurality of second light-emitting devices 31 in the second light-emitting device layer 3 at the same time, which reduces a complexity of a double-sided display structure and achieves thinning of a double-sided display panel.

It should be noted that, in addition to a problem of a thickness of a conventional double-sided display screen being large, when the conventional double-sided display screen is formed by laminating two liquid crystal displays, a technical problem of requiring two backlight modules which causes a higher power consumption also occurs. In addition, the conventional double-sided display screen formed by laminating two LED panels also has a lower resolution and is not suitable for close-up viewing. Although a thickness of the conventional double-sided display screen formed by laminating two LED panels can be reduced to a certain extent, processing large-sized OLED displays is more difficult and expensive. In this embodiment, each of the plurality of driving thin-film transistors 10 is connected to one of the plurality of first light-emitting devices 21 and one of the plurality of second light-emitting devices 31, and each of the plurality of driving thin-film transistors 10 are configured to adjust working states of each of the plurality of first light-emitting devices 21 and each of the plurality of second light-emitting devices 31. Specifically, each of the plurality of driving thin-film transistors 10 can be configured to drive each of the plurality of first light-emitting devices 21 and each of the plurality of second light-emitting devices 31 to emit light, and the working states of the plurality of first light-emitting devices 21 and the plurality of second light-emitting devices 31 can also be switched to other ones of the working states, such as extinguishing, etc. The plurality of first light-emitting devices 21 and the plurality of second light-emitting devices 31 are all micro light-emitting diodes (Micro-LEDs), and only a single one of the driving thin-film transistor 10 is required to drive each of the plurality of first light-emitting devices and each of the plurality of second light-emitting devices 31 to emit light on a front and a back of the driving substrate 1 simultaneously, so that the double-sided display panel has advantages of being thin, having high brightness, and having low power consumption.

In an embodiment, references are made to FIG. 1, and FIG. 3 to FIG. 6. The driving substrate 1 further includes:
    a first insulating layer 113;

a second insulating layer 111 disposed on a side of the first insulating layer 113;

a first metal layer 12 disposed on a side of the second insulating layer 111 away from the first insulating layer 113, wherein the first metal layer 12 includes a first terminal 121, a second terminal 122, and a power line that are connected to one of the plurality of first light-emitting devices 21 (not shown in the figures); and a second metal layer 13 disposed on a side of the first insulating layer 113 away from the second insulating layer 111, wherein the second metal layer 13 includes a third terminal 131 and a fourth terminal 132 connected to one of the plurality of second light-emitting devices 31.

The first terminal 121 and the third terminal 131 are both connected to a drain 123 of the driving thin-film transistor 10, and the second terminal 122 and the fourth terminal 132 are connected to the power line.

It can be understood that two pins of the first light-emitting device 21 are respectively connected to the first terminal 121 and the second terminal 122, and two pins of the second light-emitting device 31 are respectively connected to the third terminal 131 and the fourth terminal 132. The first metal layer 12 includes the first terminal 121 and the second terminal 122, i.e., the first terminal 121 and the second terminal 122 are arranged in a same layer, which prevents a large height difference between the first terminal 121 and the second terminal 122 from affecting connections with the first light-emitting device 21. Similarly, the second metal layer 13 includes the third terminal 131 and the fourth terminal 132 for a same reason. That is to say, the third terminal 131 and the fourth terminal 132 are arranged in a same layer, so as to prevent a large height difference between the third terminal 131 and the fourth terminal 132 from affecting connections with the second light-emitting device 31. In addition, the first terminal 121 and the third terminal 131 are both connected to the drain 123 of the driving thin-film transistor 10, and the driving substrate 1 also includes the power line connected to the second terminal 122 and the fourth terminal 132, so that driving the first light-emitting device 21 and the second light-emitting device 31 simultaneously through one of the plurality of driving thin-film transistors 10 can be achieved. Specifically, the power line can be a low-potential constant-voltage power line.

Subsequently, in this embodiment, the first metal layer 12 further includes the power line, i.e., the power line, the first terminal 121, and the second terminal 122 are arranged in a same layer, and the second terminal 122 is connected to the power line, i.e., the second terminal 122 is connected to the power line in a same layer, so that processes for manufacturing a display panel are not increased additionally.

It should be noted that the first metal layer 12 can include a source 124, the drain 123, the power line, the first terminal 121, and the second terminal 122, i.e., the source 124, the drain 123, the power line, the first terminal 121, and the second terminal 122 can all be arranged in a same layer, the first terminal 121 and the drain 123 can be connected in a same layer, the second terminal 122 is connected to the power line in a same layer, so as to minimize the processes for manufacturing the display panel.

It should be noted that an orthographic projection of the first light-emitting device 21 and an orthographic projection of the second light-emitting device 31 on the driving substrate 1 in a direction perpendicular to the driving substrate 1 do not overlap with an orthographic projection of the driving thin-film transistor 10 on the driving substrate 1 in the direction perpendicular to the driving substrate 1. Therefore, the driving substrate 1 protruding at a position corresponding to the driving thin-film transistor 10 is prevented from effecting an arrangement of the first light-emitting device 21 and the second light-emitting device 31, which not only ensures a planarization of arrangement positions of the first light-emitting device 21 and the second light-emitting device 31, but also reduces an overall thickness of the display panel.

In an embodiment, referring to FIG. 1, the driving substrate 1 includes a first through hole 100 and a second through hole 200 both passing through the second insulating layer 111 and the first insulating layer 113. The first terminal 121 is connected to the third terminal 131 through the first through hole 100, and the second terminal 122 is connected to the fourth terminal 132 through the second through hole 200.

It can be understood that the driving substrate 1 includes the first through hole 100 and the second through hole 200, the first terminal 121 is connected to the third terminal 131 through the first through hole 100. The first terminal 121 is connected to the third terminal 131 through the first through hole 100, and the second terminal 122 is connected to the fourth terminal 132 through the second through hole 200. Through having the first terminal 121 and the third terminal 131 connected, any one of the first terminal 121 and the third terminal 131 is connected to the drain 123 of the driving thin-film transistor 10, so that the connections between the driving thin-film transistor 10 and the first light-emitting device 21 and the second light-emitting device 31 can be achieved. Similarly, through having the second terminal 122 and the fourth terminal 132 connected, any one of the second terminal 122 and the fourth terminal 132 is connected to the power line, so that the second terminal 122 and the fourth terminal 132 can both be connected to the power line, thereby reducing a complexity of a driving structure for driving the first light-emitting device layer 2 and the second light-emitting device layer 3 to emit light by a single one of the driving substrate 1.

It should be noted that, the first terminal 121 and the third terminal 131 can be disposed at both ends of the first through hole 100, respectively, and the second terminal 122 and the fourth terminal 132 can be disposed at both ends of the first through hole 100, respectively. One of the plurality of first light-emitting devices 21 can be disposed corresponding to one of the plurality of second light-emitting devices 31, so that each of the plurality of first light-emitting devices 21 and each of the plurality of second light-emitting devices 31 are symmetrically arranged on two sides of the driving substrate 1, thereby ensuring a consistency of resolution and image displayed on two sides of the display panel. Specifically, an orthographic projection of the first terminal 121 on the driving substrate 1 in the direction perpendicular to the driving substrate 1 can be at least partially overlapped with an orthographic projection of the third terminal 131 on the driving substrate 1 in the direction perpendicular to the driving substrate 1, and an orthographic projection of the second terminal 122 on the driving substrate 1 in the direction perpendicular to the driving substrate 1 can be at least partially overlapped with an orthographic projection of the fourth terminal 132 on the driving substrate 1 in the direction perpendicular to the driving substrate 1.

In an embodiment, referring to FIG. 1, the first metal layer 12 further includes the source 124 and the drain 123 of the driving thin-film transistor 10, and the first terminal 121 is connected to the drain 123.

It can be understood that the first metal layer 12 further includes the source 124 and the drain 123 of the driving thin-film transistor 10, i.e., the source 124, the drain 123, the first terminal 121, and the second terminal 122 are arranged in a same layer, and the first terminal 121 is connected to the drain 123, i.e., the first terminal 121 is connected to the drain 123 in a same layer, and additional processes of manufacturing the display panel is not required. In addition, the source 124, the drain 123, the first terminal 121, and the second terminal 122 are arranged in a same layer, so that additional film layers for manufacturing the first terminal 121 and the second terminal 122 are not required, thereby preventing a thickness of the display panel from increasing.

In an embodiment, referring to FIG. 1, the driving substrate 1 further includes:

a third insulating layer 112 disposed between the second insulating layer 111 and the first insulating layer 113;

a third metal layer 14 disposed between the second insulating layer 111 and the third insulating layer 112, wherein the third metal layer 14 includes a gate 141 of the driving thin-film transistor 10; and a semiconductor layer 15 disposed between the third insulating layer 112 and the first insulating layer 113, wherein the semiconductor layer 15 includes an active layer 151 of the driving thin-film transistor 10 and the source 124 and the drain 123 of the driving thin-film transistor 10 are respectively connected to the active layer 151.

The second metal layer 13 further includes a light shielding portion 133, and an orthographic projection of the light shielding portion 133 on the driving substrate 1 in the direction perpendicular to the driving substrate 1 covers an orthographic projection of the active layer 151 on the driving substrate 1 in the direction perpendicular to the driving substrate 1.

It can be understood that the second insulating layer 111, the third insulating layer 112, and the first insulating layer 113 are disposed in a stack, the third metal layer 14 is disposed between the second insulating layer 111 and the third insulating layer 112, and the semiconductor layer 15 is disposed between the third insulating layer 112 and the first insulating layer 113. The third metal layer 14 includes the gate 141 of the driving thin-film transistor 10, the semiconductor layer 15 includes the active layer 151 of the driving thin-film transistor 10, and the gate 141 is disposed corresponding to the active layer 151. Specifically, the driving thin-film transistor 10 can have a structure of a top gate, a bottom gate, etc. In this embodiment, taking the driving thin-film transistor 10 having a top-gate structure as an example, the second insulating layer 111 is disposed between the third metal layer 14 and the first metal layer 12, the first insulating layer 113 is disposed between the semiconductor layer 15 and the second metal layer 13, and the second metal layer 13 includes the light shielding portion 133, the third terminal 131, and the fourth terminal 132, i.e., the light shielding portion 133, the third terminal 131, and the fourth terminal 132 are disposed in a same layer, which does not increase the processes for manufacturing the display panel. In addition, the orthographic projection of the light shielding portion 133 on the driving substrate 1 in the direction perpendicular to the driving substrate 1 covers the orthographic projection of the active layer 151 on the driving substrate 1 in the direction perpendicular to the driving substrate 1, so as to prevent the active layer 151 from being exposed to external light which affects an electrical performance of the driving thin-film transistor 10.

It should be noted that a passivation protection layer 16 can be further provided on the first metal layer 12, and openings 161 can be defined on the passivation protection layer 16 corresponding to positions of the first terminal 121 and the second terminal 122. The first light-emitting device 21 is connected to the first terminal 121 and the second terminal 122 in the openings 161.

In an embodiment, referring to FIG. 1, the driving substrate 1 includes a third through hole 300 passing through both the second insulating layer 111 and the first insulating layer 113, and the source 124 is connected to the light shielding portion 133 through the third through hole 300.

It can be understood that the source 124 is connected to the light shielding portion 133 through the third through hole 300, and in a process of the driving thin-film transistor 10 driving the first light-emitting device 21 and the second light-emitting device 31 to emit light, the light shielding portion 133 and the source 124 have a same potential, which facilitates a formation of a holding capacitor between the light shielding portion 133 and the gate 141, which enhances the electrical performance of the driving thin-film transistor 10.

In an embodiment, referring to FIG. 1, the display panel further includes a first encapsulation layer 4 and a second encapsulation layer 5. The first encapsulation layer 4 covers the first light-emitting device layer 2, and the second encapsulation layer 5 covers the second light-emitting device layer 3.

It can be understood that, the first encapsulation layer 4 covers the first light-emitting device layer 2, and the first encapsulation layer 4 is configured to encapsulate the first light-emitting device layer 2. The second encapsulation layer 5 covers the second light-emitting device layer 3, and the second encapsulation layer 5 is configured to encapsulate the second light-emitting device layer 3. In addition, a first circular polarizer can be disposed on a side of the first encapsulation layer 4 away from the second encapsulation layer 5, and a second circular polarizer can be disposed on a side of the second encapsulation layer 5 away from the first encapsulation layer 4. Apparently, through an arrangement of the first circular polarizer and the second circular polarizer, reflections of the first metal layer 12 and the second metal layer 13 can be prevented from affecting an appearance of the display panel.

Correspondingly, an embodiment of the present application also provides a manufacturing method of a display panel. Referring to FIG. 2 to FIG. 6, the manufacturing method includes the following steps:

S100: providing a base 6, and forming a driving substrate 1 on the base 6, wherein the driving substrate 1 includes a plurality of driving thin-film transistors 10;

S200: forming a first light-emitting device layer 2 on a side of the driving substrate 1 away from the base 6, wherein the first light-emitting device layer 2 includes a plurality of first light-emitting devices 21;

S300: removing the base 6 from the driving substrate 1;

S400: forming a second light-emitting device layer 3 on a side of the driving substrate 1 away from the first light-emitting device layer 2, wherein the second light-emitting device layer 3 includes a plurality of second light-emitting devices 31, and each one of the plurality of driving thin-film transistors 10 is connected to one of the plurality of first light-emitting devices 21 and one of the plurality of second light-emitting devices 31.

Figure 3:
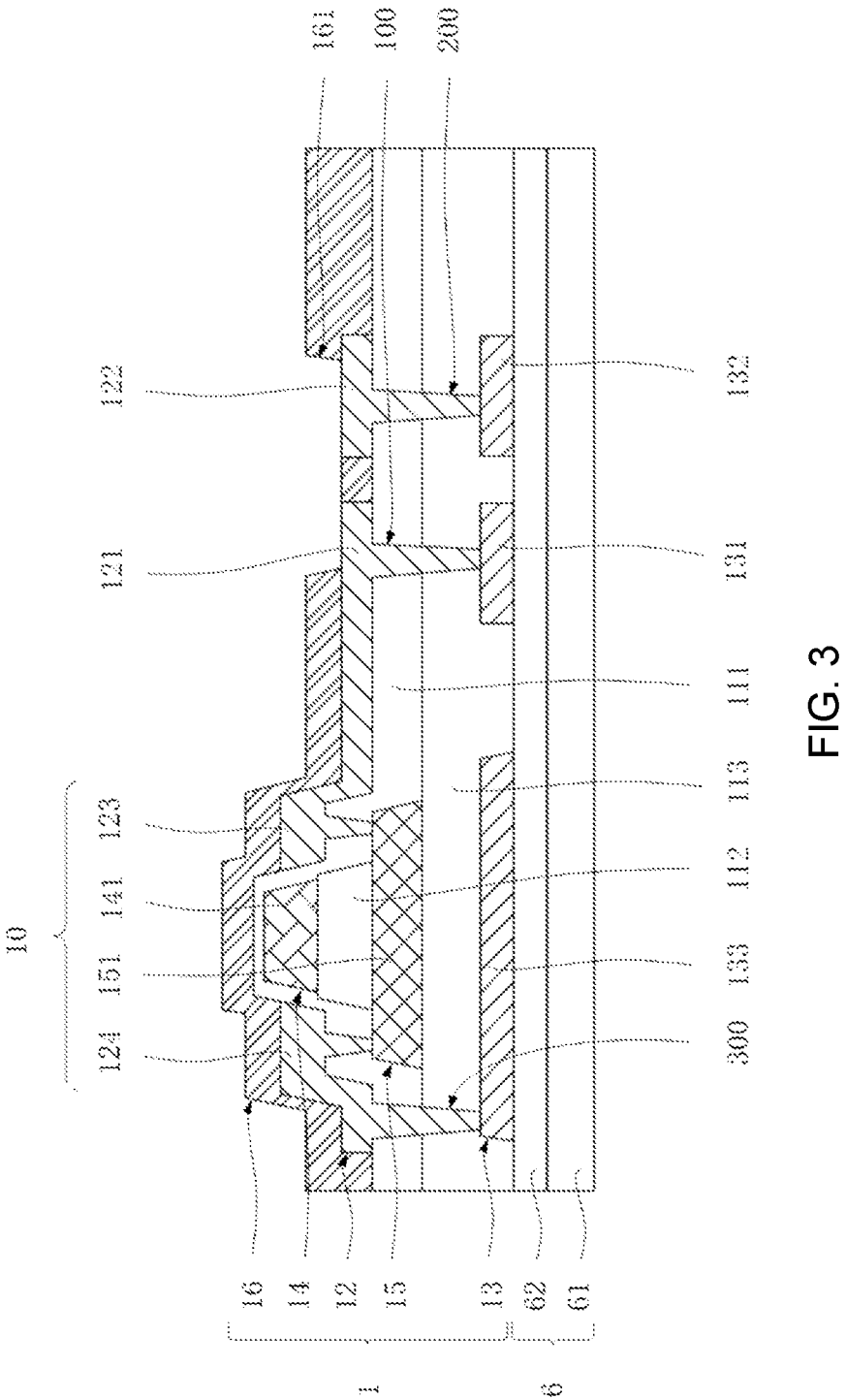
FIG. 3 to FIG. 6 are structural schematic views illustrating the manufacturing method of the display panel provided by an embodiment of the present application.
Figure 5:
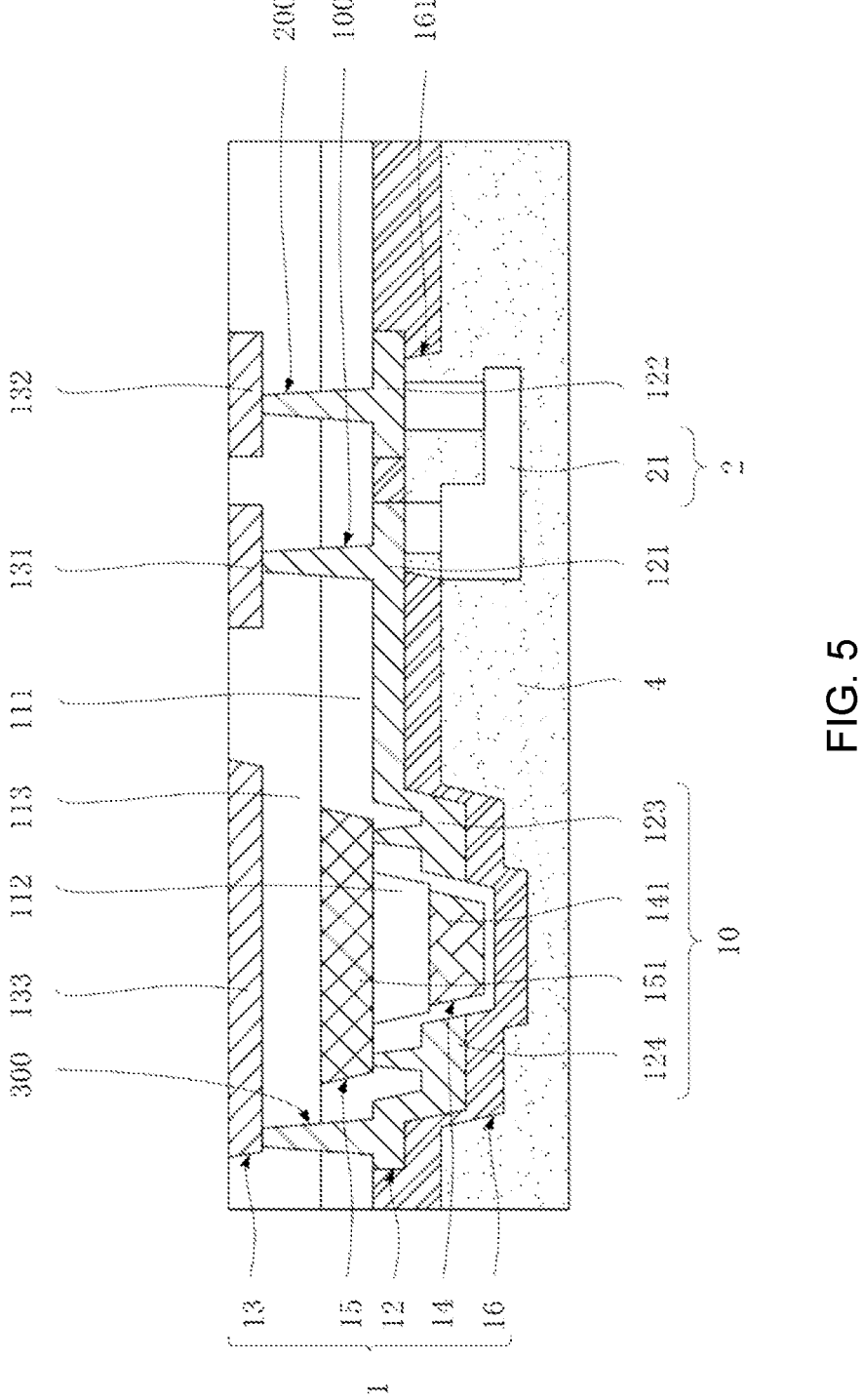
Figure 6:
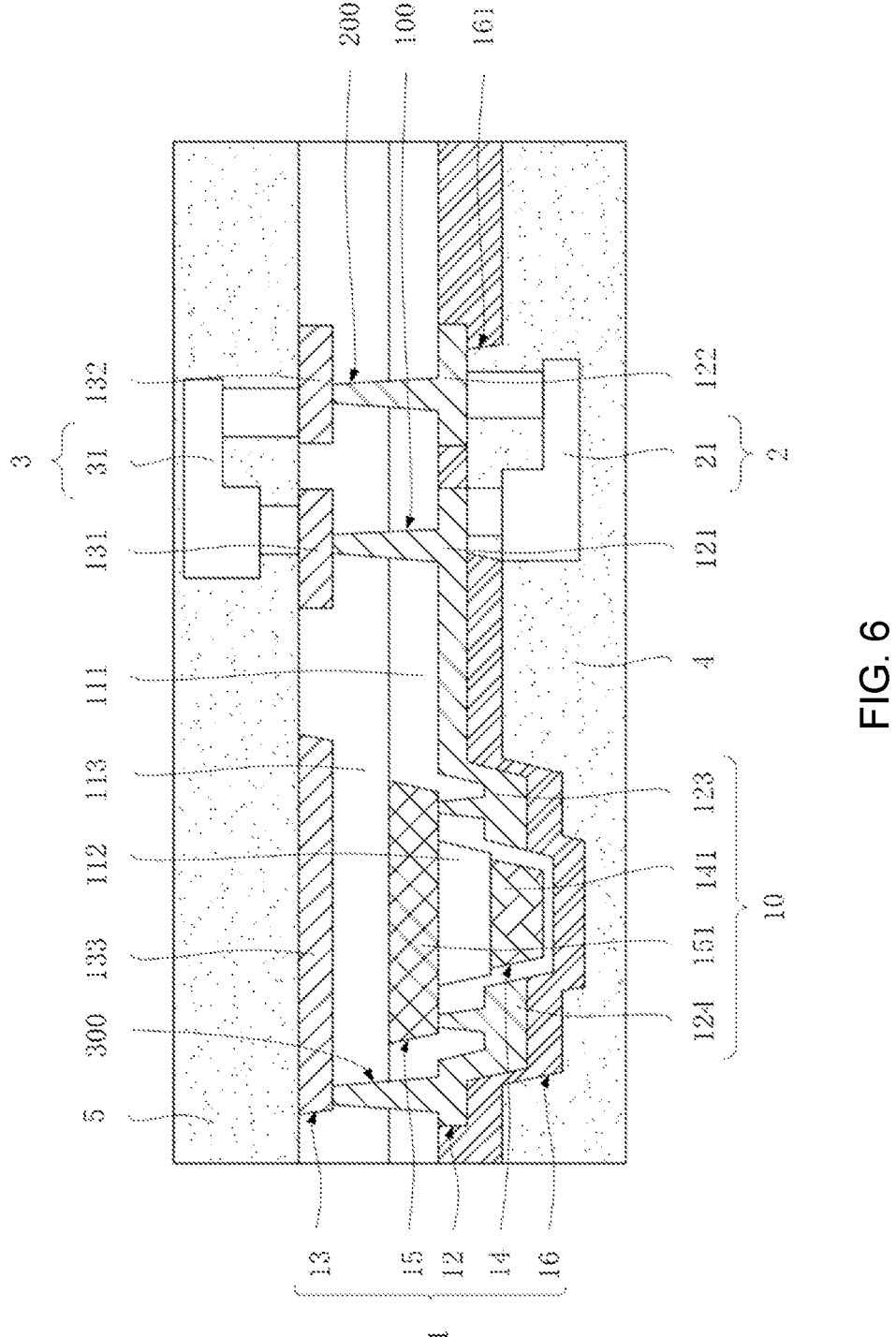

It can be understood that, as shown in FIG. 3, in step S100, the base 6 is provided, and the base 6 can include a rigid substrate 61 and a flexible substrate 62 disposed on the rigid substrate 61. The rigid substrate 61 can be a glass substrate, and a material of the flexible substrate 62 can be polyimide. The driving substrate 1 is formed on the base 6, and the driving substrate 1 includes a first insulating layer 113, a third insulating layer 112, and a second insulating layer 111 that are sequentially stacked on the base 6, a first metal layer 12 disposed on a side of the second insulating layer 111 away from the base 6, and a second metal layer 13 disposed between the first insulating layer 113 and the substrates 6. The first metal layer 12 can include a first terminal 121 and a second terminal 122 for connecting with the first light-emitting device 21. The second metal layer 13 can include a third terminal 131 and a fourth terminal 132 for connecting with the second light-emitting device 31. Furthermore, forming the driving substrate 1 on the base 6 includes: forming the second metal layer 13 on the base 6; forming the first insulating layer 113 covering the second metal layer 13 on the base 6 and the second metal layer 13; forming the third insulating layer 112 on the first insulating layer 113; forming the second insulating layer 111 on the third insulating layer 112; and, finally, forming the first metal layer 12 on the second insulating layer 111. As shown in FIG. 5, in step S300, removing the base 6 from the driving substrate 1 includes: removing the rigid substrate 61 by a laser removing method; and then, removing the flexible substrate 62 by a dry etching method.

Figure 4:
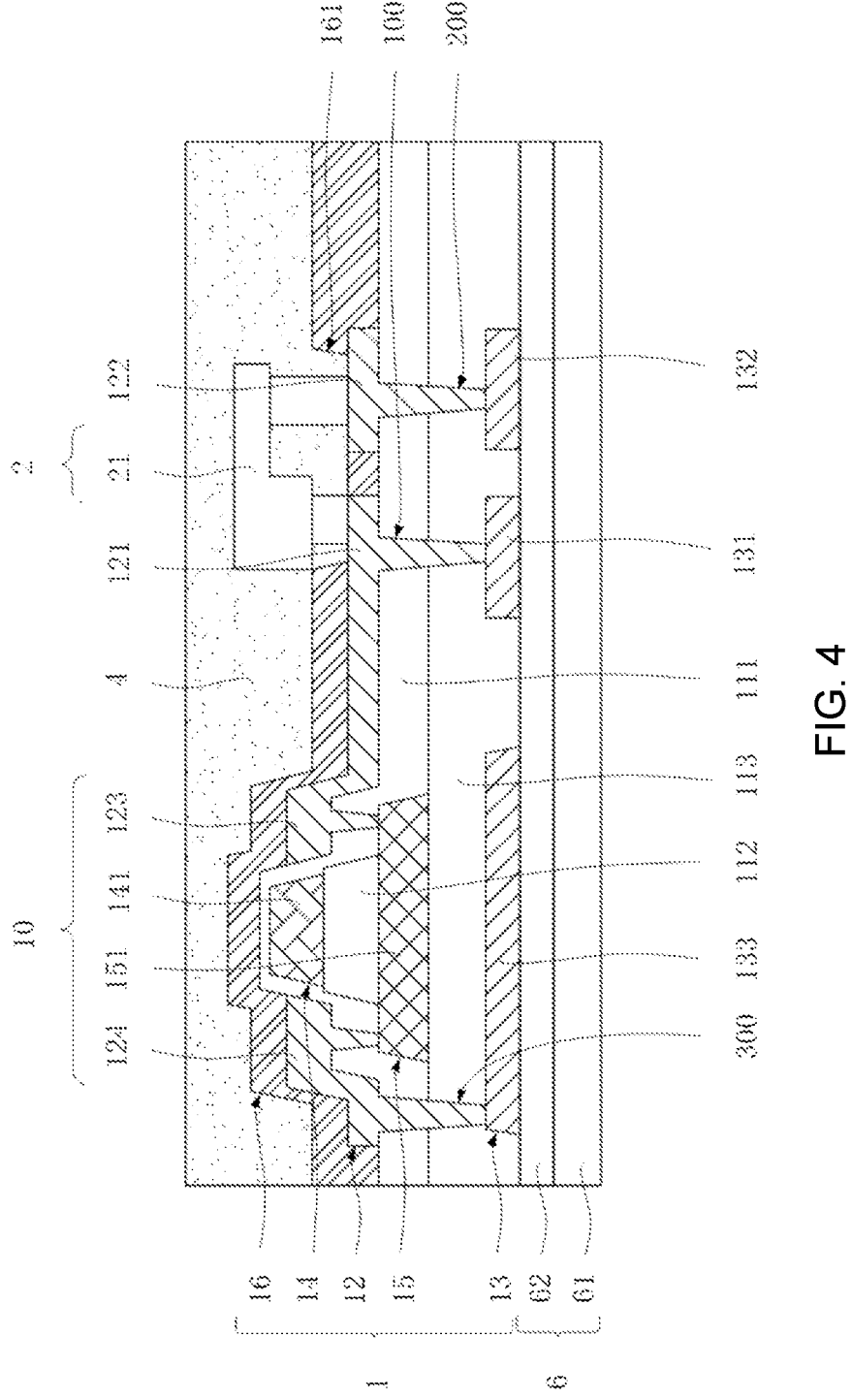

It should be noted that, as shown in FIG. 4 to FIG. 5, after a step of forming the first light-emitting device layer 2 on the side of the driving substrate 1 away from the base 6, the manufacturing method further includes: forming a first encapsulation layer 4 covering the first light-emitting device layer 2 on the driving substrate 1 and the first light-emitting device layer 2. After a step of forming a second light-emitting device layer 3 on the side of the driving substrate 1 away from the first light-emitting device layer 2, the manufacturing method further includes: forming a second encapsulation layer 5 covering the second light-emitting device layer 3 on the side of the driving substrate 1 away from the first light-emitting device layer 2, and further includes a step of binding an integrated circuit (IC) on the driving substrate 1, which will not be reiterated herein.

Correspondingly, an embodiment of the present application further provides a display device, wherein the display device includes the display panel described in any one of the afore-mentioned embodiments.

In the embodiments of the present application, the first light-emitting device layer 2 and the second light-emitting device layer 3 are respectively disposed on the two sides of the driving substrate 1, and a single one of the plurality of driving thin-film transistors 10 can be configured to drive each of the plurality of first light-emitting devices 21 in the first light-emitting device layer 2 and each of the plurality of second light-emitting devices 31 in the second light-emitting device layer 3 on the front and the back to emit light, simultaneously, which reduces a complexity of the double-sided display structure and achieves lightening and thinning of the double-sided display panel.

The embodiments provided by the present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application.

Above all, the content of the specification should not be the limitation of the present application.

What is claimed is:

1. A display panel, comprising:

a driving substrate;

a first light-emitting device layer disposed on a side of the driving substrate, wherein the first light-emitting device layer comprises a plurality of first light-emitting devices; and a second light-emitting device layer disposed on a side of the driving substrate away from the first light-emitting device layer, wherein the second light-emitting device layer comprises a plurality of second light-emitting devices;

wherein the driving substrate comprises:

a first insulating layer;

a second insulating layer disposed on a side of the first insulating layer;

a first metal layer disposed on a side of the second insulating layer away from the first insulating layer, wherein the first metal layer comprises a first terminal and a second terminal, and the first terminal and the second terminal are arranged in a same layer and are connected to one of the plurality of first light-emitting devices;

a second metal layer disposed on a side of the first insulating layer away from the second insulating layer, wherein the second metal layer comprises a third terminal and a fourth terminal, and the third terminal and the fourth terminal are arranged in a same layer and are connected to one of the plurality of second light-emitting devices;

a plurality of driving thin-film transistors; and a first through hole and a second through hole passing through both the second insulating layer and the first insulating layer, wherein the first terminal is connected to the third terminal through the first through hole, the first terminal and the third terminal are connected to a drain of one of the plurality of driving thin-film transistors, and the second terminal is connected to the fourth terminal through the second through hole.

2. The display panel according to claim 1, wherein the first metal layer further comprises a source and the drain of one of the plurality of driving thin-film transistors, and the first terminal is connected to the drain.

3. The display panel according to claim 1, wherein the driving substrate further comprises:

a third insulating layer disposed between the second insulating layer and the first insulating layer;

a third metal layer disposed between the second insulating layer and the third insulating layer, wherein the third metal layer comprises a gate of one of the plurality of driving thin-film transistors; and a semiconductor layer disposed between the third insulating layer and the first insulating layer, wherein the semiconductor layer comprises an active layer of one of the plurality of driving thin-film transistors, and the source and the drain of one of the plurality of driving thin-film transistors are respectively connected to the active layer;

wherein the second metal layer further comprises a light shielding portion, and an orthographic projection of the light shielding portion on the driving substrate in a direction perpendicular to the driving substrate covers an orthographic projection of the active layer on the driving substrate in the direction perpendicular to the driving substrate.

4. The display panel according to claim 3, wherein the driving substrate comprises a third through hole passing through both the second insulating layer and the first insulating layer, and the source is connected to the light shielding portion through the third through hole.

5. The display panel according to claim 1, wherein the display panel further comprises a first encapsulation layer and a second encapsulation layer, the first encapsulation layer covers the first light-emitting device layer, and the second encapsulation layer cover the second light-emitting device layer.

6. A manufacturing method of a display panel, comprising:

providing a base, and forming a driving substrate on the base;

forming a first light-emitting device layer on a side of the driving substrate away from the base, wherein the first light-emitting device layer comprises a plurality of first light-emitting devices;

removing the base from the driving substrate;

forming a second light-emitting device layer on a side of the driving substrate away from the first light-emitting device layer, wherein the second light-emitting device layer comprises a plurality of second light-emitting devices;

wherein the driving substrate comprises:

a first insulating layer;

a second insulating layer disposed on a side of the first insulating layer;

a first metal layer disposed on a side of the second insulating layer away from the first insulating layer, wherein the first metal layer comprises a first terminal and a second terminal, and the first terminal and the second terminal are arranged in a same layer and are connected to one of the plurality of first light-emitting devices;

a second metal layer disposed on a side of the first insulating layer away from the second insulating layer, wherein the second metal layer comprises a third terminal and a fourth terminal, and the third terminal and the fourth terminal are arranged in a same layer and are connected to one of the plurality of second light-emitting devices;

a plurality of driving thin-film transistors; and a first through hole and a second through hole passing through both the second insulating layer and the first insulating layer, wherein the first terminal is connected to the third terminal through the first through hole, the first terminal and the third terminal are connected to a drain of one of the plurality of driving thin-film transistors, and the second terminal is connected to the fourth terminal through the second through hole.

7. The manufacturing method according to claim 6, wherein the base comprises a rigid substrate and a flexible substrate formed on the rigid substrate;

wherein a step of removing the base from the driving substrate comprises:

removing the rigid substrate by a laser removing method; and removing the rigid substrate by a dry etching method.

8. A display device, wherein the display device comprises the display panel according to claim 1.

\* \* \* \* \*